(12) United States Patent
Wu et al.

(10) Patent No.: US 12,111,546 B2
(45) Date of Patent: Oct. 8, 2024

(54) ARRAY SUBSTRATE, LIQUID CRYSTAL DISPLAY PANEL, AND CONTROL METHOD

(71) Applicant: HKC CORPORATION LIMITED, Shenzhen (CN)

(72) Inventors: Di Wu, Shenzhen (CN); Haibo Li, Shenzhen (CN); Yao Chen, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/092,167

(22) Filed: Dec. 30, 2022

(65) Prior Publication Data

US 2023/0367161 A1   Nov. 16, 2023

(30) Foreign Application Priority Data

May 10, 2022   (CN) .......................... 202210502847.4

(51) Int. Cl.
| | | |
|---|---|---|
| G02F 1/1362 | (2006.01) | |
| G09G 3/00 | (2006.01) | |
| G09G 3/36 | (2006.01) | |
| H01L 27/12 | (2006.01) | |
| G02F 1/1335 | (2006.01) | |
| H03M 1/12 | (2006.01) | |

(52) U.S. Cl.
CPC .. *G02F 1/136254* (2021.01); *G02F 1/136286* (2013.01); *G09G 3/006* (2013.01); *G09G 3/3622* (2013.01); *H01L 27/124* (2013.01); *G02F 1/133528* (2013.01); *G09G 2310/0202* (2013.01); *G09G 2320/0233* (2013.01); *H03M 1/124* (2013.01)

(58) Field of Classification Search
CPC ......... G02F 1/136254; G02F 1/136286; G02F 1/133528; G09G 3/006; G09G 3/3622; G09G 2310/0202; G09G 2320/0233; H01L 27/124; H03M 1/124
See application file for complete search history.

(56) References Cited

U.S. PATENT DOCUMENTS

| | | | |
|---|---|---|---|
| 2014/0071363 | A1 | 3/2014 | Que et al. |
| 2020/0118506 | A1* | 4/2020 | Yamamoto ................ G09F 9/30 |
| 2020/0127473 | A1* | 4/2020 | Zhang ................ H02J 7/00034 |

(Continued)

FOREIGN PATENT DOCUMENTS

| | | |
|---|---|---|
| CN | 106842749 A | 6/2017 |
| CN | 107180594 A | 9/2017 |

(Continued)

*Primary Examiner* — Kenneth B Lee, Jr.
(74) *Attorney, Agent, or Firm* — Franklin & Associates International Inc; Matthew F. Lambrinos

(57) ABSTRACT

Disclosed are an array substrate, a liquid crystal display panel, and a control method. The array substrate (1) comprises a plurality of connecting wire assemblies (20) and a driver (30), each connecting wire assembly (20) comprises a wiring group (22) and an acquisition module (21), the acquisition module (21) is used to detect the electrical parameters of the wiring group (22) and feed them back to the driver (30). The present disclosure can adjust the input voltage according to the impedance of the wiring group (20), so that the driving voltage of each data line or each scanning line is the same and the display uniformity can be improved.

13 Claims, 2 Drawing Sheets

(56) References Cited

U.S. PATENT DOCUMENTS

| | | | |
|---|---|---|---|
| 2021/0011505 A1 | 1/2021 | Chien | |
| 2022/0020333 A1* | 1/2022 | Cho | G06F 3/04184 |
| 2022/0180815 A1* | 6/2022 | Kim | G09G 3/3233 |
| 2022/0187939 A1* | 6/2022 | Lee | G06F 3/0416 |
| 2022/0208801 A1* | 6/2022 | Itoh | G09G 3/3648 |

FOREIGN PATENT DOCUMENTS

| | | |
|---|---|---|
| CN | 111243551 A | 6/2020 |
| CN | 114637148 A | 6/2022 |
| EP | 3259751 A1 | 12/2017 |
| JP | 2010243527 A | 10/2010 |
| KR | 20170008332 A | 1/2017 |

* cited by examiner

ARRAY SUBSTRATE, LIQUID CRYSTAL DISPLAY PANEL, AND CONTROL METHOD

CROSS-REFERENCE TO RELATED APPLICATIONS

This present application claims priority under 35 U.S.C. § 119 to Chinese patent disclosure No. 202210502847.4 filed on May 10, 2022 with the Patent Office of the State Intellectual Property Office of the People's Republic of China, entitled "An array substrate, liquid crystal display panel and control method thereof", the contents of which are explicitly incorporated herein by reference in their entirety.

FIELD

The present disclosure relates to the technical field of displays, and in particular, to an array substrate, a liquid crystal display panel and a control method thereof.

BACKGROUND

Liquid Crystal Display (LCD) has the advantages of good picture quality, small size, light weight, low driving voltage, low power consumption, no radiation and relatively low manufacturing cost, and currently dominates the field of flat panel displays. Liquid display devices are well suited for use in desktop computers, palmtop computers, personal digital assistants, cellular phones, televisions, and various office automation and audiovisual equipment.

The liquid crystal display panel is an important part of the liquid crystal display device. In the liquid crystal display panel, the screen display in the display area needs to be driven by gate scanning signals and data signals. The scanning signals and data signals of some liquid crystal display panels are driven by integrated circuits IC outside the display area, the signal transmission needs to pass through a group of fan-shaped wiring areas and then enter the display pixel area. The signal is affected by the impedance of the wiring, so that after the voltage output from the integrated circuit IC passes through the wiring area, the signal voltage difference in the pixel display area is relatively large and uneven.

The above-mentioned uneven distribution of voltage at different positions due to the effect of wiring resistance and capacitance will cause uneven display of the liquid crystal display panel, split screen afterimage and other phenomena, which will affect the quality of the screen display and reduce the display effect of the liquid crystal display panel. For example the input voltage of each row of scan lines being different will result in inconsistent scan signal waveforms, which will cause different feed-through voltages to cause poor vertical display uniformity. The input voltage of each column of data lines being different may cause poor uniformity of horizontal display.

SUMMARY

The present disclosure aims to solve the technical problems existing in the prior art. To this end, the present disclosure proposes an array substrate, the array substrate can determine the electrical parameters of the first wiring by an acquisition module and provide an appropriate input voltage according to the electrical parameters of the wiring group, so that after the voltage dropping through different wiring groups, the driving voltage of each data line is the same or the driving voltage of each scan line is the same.

In a first aspect, the present disclosure provides an array substrate used in a liquid crystal display panel, the liquid crystal display panel comprises a display area and a non-display area, the array substrate comprises a first area and a second area, the first area corresponds to the display area, the second area corresponds to the non-display area. The first area comprises a plurality of pixel parts, a plurality of first control lines, and a plurality of second control lines, the first control lines comprise one of the scan lines and the data lines, the second control lines comprise the other of the scan lines and the data lines. The second area comprises a plurality of connecting wire assemblies and a driver, each connecting wire assembly comprises a wiring group and an acquisition module, the driver is electrically connected with the input end of the wiring group to provide input voltage to the wiring group, the output end of the wiring group is electrically connected with the first control line, the input end of the acquisition module is electrically connected with the output end of the wiring group, the output end of the acquisition module is electrically connected with the driver, and the acquisition module is used to detect the electrical parameters of the wiring group and feedback to the driver.

According to the array substrate of an embodiment of the present disclosure, by setting the acquisition module, the acquisition module can measure the electrical parameters of the wiring group, such as current, voltage, impedance and other electrical parameters, and the driver determines the input voltages of the wiring groups according to the electrical parameters measured by the acquisition module, so that the input voltages of each data line are equal, or the input voltages of each scan line are equal, therefore the liquid crystal display panel can display uniformly.

In a second aspect, the present disclosure provides a liquid crystal display panel, comprising a first polarizer, the above-mentioned array substrate, a liquid crystal layer, a color filter substrate, and a second polarizer stacked in sequence along the first direction.

According to the liquid crystal display panel of an embodiment of the present disclosure, the display uniformity can be improved, and the possibility of occurrence of a split screen afterimage and other phenomena can be reduced.

In a third aspect, the present disclosure provides a control method of the array substrate of the present disclosure, applied to the above-mentioned array substrate, comprising: generating detection information by detecting the electrical parameters of each wiring group by an acquisition module; feeding back the detection information to the driver by the acquisition module; receiving the detection information and calculating and analyzing the detection information by the driver; and providing a corresponding input voltage to each wiring group so that the driving voltage of each data line is equal or the driving voltage of each scan line is equal.

According to the control method of an embodiment of the present disclosure, the driver can provide different input voltages according to the impedance of each wiring group, so that after voltage dropping of different wiring groups, the driving voltage of each data line are all equal, or the scanning voltage of each data line are all equal, thereby improving the display effect of the liquid crystal display panel.

DETAILED DESCRIPTION

Figure 1:
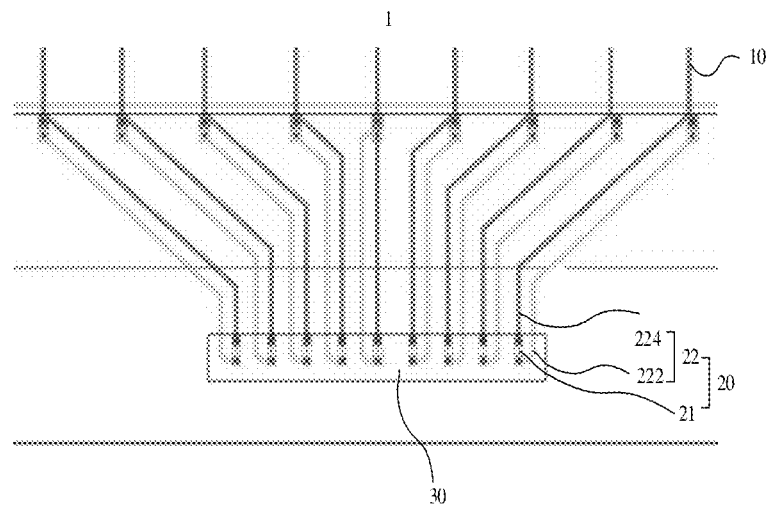
FIG. 1 is a partial schematic diagram of an array substrate according to an embodiment of the present disclosure.

In order to more clearly explain the technical solution of the embodiments of the disclosure, the specific embodiments of the disclosure will be described below against the attached drawings. Obviously, the drawings described below are only some embodiments of the disclosure, for ordinary skilled persons in the art, without the premise of creative work, can also obtain other drawings according to these drawings, and obtain other embodiments.

For brevity of the drawings, only those parts relevant to the present disclosure are shown schematically in the drawings, and they do not represent the actual structure of the drawings as products. In addition, in order to make the picture concise and easy to understand, in some drawings, the parts with the same structure or function are only drawn schematically, or only one of them is marked. Herein, "one" means not only "only one", but also "more than one".

A further detailed description of this disclosure will be given below in combination with the attached drawings and examples.

First Embodiment

According to an embodiment of the present disclosure, an array substrate 1 is used for the liquid crystal display panel 100, the liquid crystal display panel 100 comprises a display area and a non-display area, the array substrate 1 comprises a first area and a second area, the first area corresponds to the display area, and the second area corresponds to the non-display area. The first area comprises a plurality of pixel parts, a plurality of first control lines 60 and a plurality of second control lines. The first control line 60 comprises one of a scan line and a data line, and the second control line comprises the other one of a scan line and a data line, that is, in some embodiments, the first control line 60 is a scan line, the second control line is a data line; in other embodiments, the first control line 60 is a data line, and the second control line is a scan line. The pixel part comprises a thin film triode and a pixel electrode electrically connected with the thin film triode. The gate electrode of the thin film triode is electrically connected with the corresponding scan line, the source electrode of the thin film triode is electrically connected with the corresponding data line, and the drain electrode of the thin film triode is electrically connected with the corresponding pixel electrode. The drive voltage is input by each row of scan lines, which can control the pixel electrodes of each row to be turned on in sequence. After the pixel electrodes are turned on, the drive voltages are input by the data lines of each column, so that the pixel electrodes write voltages to realize image displaying.

It can be understood that when the driver 30 provides the driving voltage to the data line, the output end of the wiring group 22 is electrically connected with the data line, when the driver 30 provides the driving voltage to the scan line, the output end of the wiring group 22 is electrically connected with the scan line.

As shown in FIG. 1, in some embodiments, the second area comprises a plurality of connecting wire assemblies 20 and a driver 30, each connecting wire assembly 20 comprises a wiring group 22 and an acquisition module 21, the driver is electrically connected with the input end of the wiring group 22 and the driver provides the input voltage to the wiring group 22. The output end of the wiring group 22 is electrically connected with the data line, the wiring group 22 provides the input driving voltage to the data line. The acquisition module 21 is electrically connected with the output end of the wiring group 22, the output end of the acquisition module 21 is electrically connected with the driver 30. The acquisition module 21 is used to detect the electrical parameters of the wiring group 22 and feed it back to the driver 30. The driver 30 controls the input voltage based on the electrical parameters of different wiring groups 22, so that the input driving voltage of each data line is equal.

The plurality of connecting wire assemblies 20 are in one-to-one correspondence with the plurality of data wires, and the output ends of each wiring group 22 are electrically connected with the data wires.

In some embodiments, the second area comprises a plurality of connecting wire assemblies 20 and a driver 30, each connecting wire assembly 20 comprises a wiring group 22 and an acquisition module 21, the driver 30 is electrically connected with the input end of the wire group 22 and the driver 30 provides an input voltage to the wiring group 22. The output end of the wiring group 22 is electrically connected with the scan line, the wiring group 22 provides an input driving voltage to the scan line. The acquisition module 21 is electrically connected with the output end of the wiring group 22, the output end of the acquisition module 21 is electrically connected with the driver 30, the acquisition module 21 is used to detect the electrical parameters of the wiring group 22 and feed it back to the driver 30, and the driver 30 controls the input voltage according to the electrical parameters of the different wiring groups 22, therefore, the input driving voltages of each scan line are equal.

In some embodiments, the plurality of connecting line assemblies 20 correspond to the plurality of scan lines one-to-one, and the output end of each wiring group 22 is electrically connected with the scan line.

Wherein, the electrical parameters of the wiring group 22 measured by the acquisition module 21 comprise one of current, voltage or impedance, the acquisition module 21 feeds back the measured electrical parameters to the driver and determines the driving voltage of each wiring group 22 according to the electrical parameters, so that the input voltage of each data line is equal, or the input voltage of each scan line is equal, so that the liquid crystal display panel 100 can display uniformly.

For example, when the acquisition module 21 collects current parameters, the acquisition module 21 is arranged in the wiring group 22 for detecting the current in the wiring group 22. According to the formula U=IR, due to the different impedance of different wiring groups 22, the driver 30 can calculate and analyze to input different driving voltages so that the currents flowing through each wiring group 22 are equal, so that the driving voltages in each data line are equal, or the driving voltages in each scanning line are equal.

For example, when the acquisition module 21 collects voltage parameters, the acquisition module 21 is electrically connected with the output end of the wiring group 22, so that the voltage at the output end of the wiring group 22 can be collected, the voltage drop of the wiring group 22 can be determined by the input voltage and the voltage at the output end of the wiring group 22, so that the driver 30 can calculate and analyze to provide different input voltages, thus the driving voltages in each data line are equal, or the driving voltages in each scan line are equal.

According to the array substrate 1 of an embodiment of the present disclosure, by setting the acquisition module 21, the acquisition module 21 can measure the electrical parameters of the wiring group 22, such as current, voltage, impedance and other electrical parameters. The driver 30 can determine the magnitude of the input voltage of the wiring group 22 according to the electrical parameters measured by the acquisition module 21, so that the driving voltage of each data line is equal, or the driving voltage of each scan line is equal, thus the liquid crystal display panel 100 can display uniformly.

Figure 2:
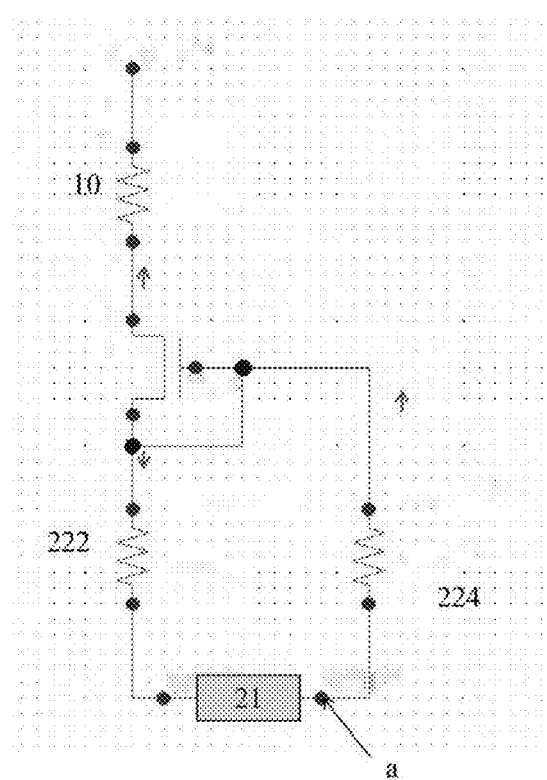
FIG. 2 is a schematic diagram of an equivalent circuit of an array substrate according to an embodiment of the present disclosure.

As shown in FIG. 2, according to the array substrate 1 of an embodiment of the present disclosure, the acquisition module 21 comprises a current sensor, the wiring group 22 comprises a first wiring 224 and a second wiring 222, the first wiring 224 comprises a first end and a second end, the second wiring 222 comprises a third end and a fourth end. The first end and the third end are both electrically connected with the input end of one same data line, the second end and the fourth end are respectively connected with two ends of the acquisition module 21, the acquisition module 21 and the driver 30 are jointly integrated in the integrated circuit IC.

It should be noted that since the first wiring 224 and the second wiring 222 are both electrically connected with one same data line, the impedance of the first wiring 224 and the impedance of the second wiring 222 are regarded as equal, therefore, when wiring, within the process range and the error range, the length and width of the first wiring 224 and the second wiring 222 are the same.

Figure 3:
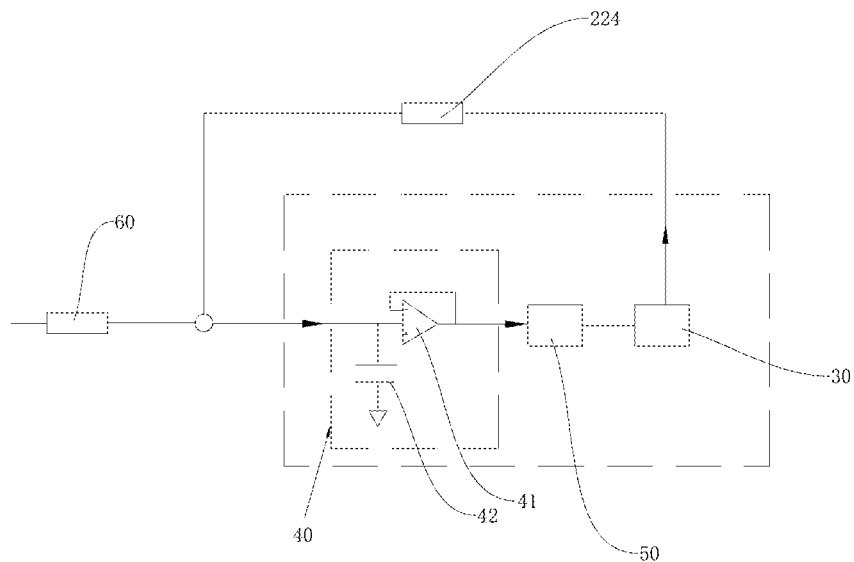
FIG. 3 is a schematic diagram of an equivalent circuit of an array substrate according to another embodiment of the present disclosure.

In some embodiments, the acquisition module comprises a sampling circuit 40 and an analog-to-digital converter 50, the input end of the sampling circuit 40 is electrically connected with the output end of the wiring group 22, the output end of the sampling circuit 40 is electrically connected with the output end of the analog-to-digital converter 50, the input end of the analog-to-digital converter 50 is electrically connected with the driver 30. As shown in FIG. 3, the sampling circuit 40 comprises an amplifier 41 and a filter capacitor 42. The amplifier 41 is used to increase the signal amplitude, that is, to amplify the collected electrical parameter information through the amplifier 41, which can improve the accuracy of detection. The filter capacitor 42 is used for filtering, reducing the influence of the alternating pulsating current on the sampling circuit 40, while absorbing current fluctuations and other disturbances generated during the operation of the sampling circuit 40, so that the working performance of the sampling circuit 40 is more stable.

The wiring group 22 comprises a first wiring 224 and a second wiring 222, the first wiring 224 comprises a first end and a second end, the second wiring 222 comprises a third end and a fourth end, the first end and the third end are both electrically connected with the input end of a same first control line 60, the second end is electrically connected with the driver 30, and the fourth end is electrically connected with the output end of the sampling circuit 40. In some embodiments, the first control line 60 is a data line, in other embodiments, the first control line 60 is a scan line.

The array substrate 1 comprises a substrate, a first metal layer, an insulating layer, a semiconductor layer, and a second metal layer stacked in sequence along a first direction.

Optionally, the first wiring 224 and the second wiring 222 are both disposed on the second metal layer, with projecting in a plane parallel to the substrate, the first wiring 224 and the second wiring 222 are spaced apart.

It should be noted that since the data lines are provided on the second metal layer, the first wiring 224 and the second wiring 222 are both provided on the second metal layer can simplify the electrical connection of the data lines with the first wiring 224 and the second wiring 222. Similarly, since the first wiring 224 and the second wiring 222 are arranged on the second metal layer, if the distance is too small, signal coupling may easily occur, thus the distance between the first wiring 224 and the second wiring 222 should be set reasonably, the spacing should be at least 6 μm or more.

Optionally, the first wiring 224 is provided on one of the first metal layer and the second metal layer, the second wiring 222 is provided on the other of the first metal layer and the second metal layer, with projecting in a plane parallel to the substrate, the first wiring 224 and the second wiring 222 are spaced apart or at least partially overlapped. For example, in some embodiments, the first wiring 224 is provided on the first metal layer, the second wiring 222 is provided on the second metal layer, the driver 30 provides an input voltage between the acquisition module 21 and the second wiring 222, arrangement of via holes can be reduced, as shown in the equivalent circuit diagram in FIG. 0.2, the driver 30 inputs a driving voltage to the data line from point a.

For example, in some embodiments, the first wiring 224 is provided on the second metal layer, the first wiring 224 is provided on the first metal layer, the driver 30 provides an input voltage between the acquisition module 21 and the first wiring 224, numbers of the vias holes can be reduced.

It can be understood that providing the first wiring 224 and the second wiring 222 on different metal layers can prevent the first wiring 224 and the second wiring 222 from generating signal coupling. Therefore, the distance between the adjacent two first wirings 224 or the adjacent two second wirings 222 can be reasonably arranged.

Optionally, the metal forming the first wiring 224 is any one or any alloy of molybdenum, aluminum, chromium or copper, the metal forming the second wiring 222 is any one or any alloy of molybdenum, aluminum, chromium or copper, when the first wiring 224 and the second wiring 222 are provided in the same metal layer, the metal forming the first wiring 224 and the second wiring 222 is the same.

Optionally, the first wiring 224 is provided on the first metal layer, the second wiring 222 is provided on the second metal layer, the driver 30 inputs a driving voltage between the acquisition module 21 and the second wiring 222, with projecting in a plane parallel to the substrate, the first wiring 224 and the second wiring 222 overlap, the first wiring 224 and the second wiring 222 have the same line width.

Optionally, a switch triode is provided between the connecting wire assembly 20 and the corresponding data line, the gate electrode of the switch triode is electrically connected with the first end, the drain electrode of the switch triode is electrically connected with the third end, the source electrode of the switch triode is electrically connected with the data line, and the gate electrode of the switching triode is short-circuited with the drain electrode of the switching triode. The gate and drain electrode of the switching triode here are short-circuited, so that the function of the switching triode is equivalent to a diode, the conduction direction of which being the direction from the wiring group 22 to the data line, the cut-off direction of which being the direction from the data line to the wiring group 22, so that after the driver 30 provides the input voltage, the current can only flow in the direction from the wiring group 22 to the data line, but cannot flow in the direction from the data line to the wiring group 22. Compared with the manufacture of diodes, fabricating on the array substrate 1 of the switching triode can simplify the manufacturing process.

Second Embodiment

Figure 4:
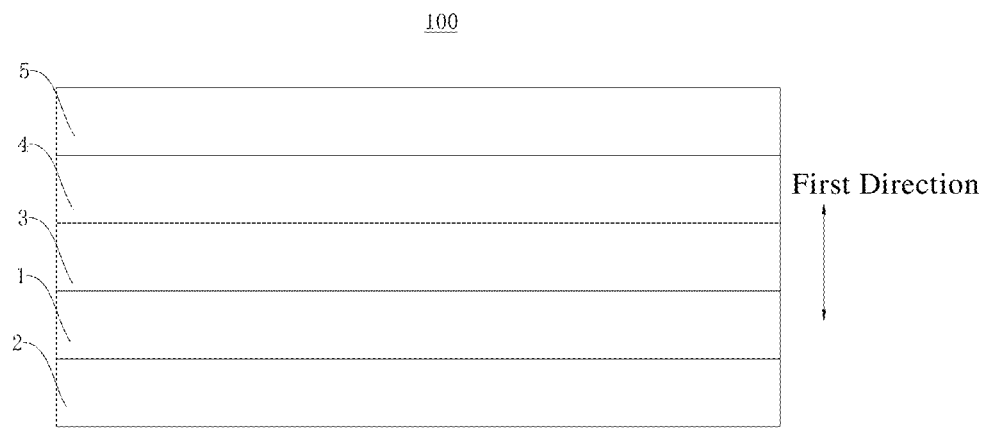
FIG. 4 is a schematic diagram of a liquid crystal display panel according to an embodiment of the present disclosure.

As shown in FIG. 4, a liquid crystal display panel 100 according to an embodiment of the present disclosure comprises a first polarizer 2, the above-mentioned array substrate 1, a liquid crystal layer 3, a color filter substrate 4 and a second polarizer 5 stacked along the first direction. The structure of the array substrate 1 refers to the first embodiment. The liquid crystal display panel 100 comprises a display area and a non-display area, the array substrate 1 comprises a first area and a second area, the first area corresponds to the display area, the second area corresponds to the non-display area, the first area comprises a plurality of pixel parts, a plurality of first control lines 60 and a plurality of second control lines. The first control line 60 comprises one of the scan line and data line, and the second control line comprises the other of the scan line and data line. The pixel part comprises a thin film transistor and a pixel electrode electrically connected with the thin film transistor, the gate electrode of the thin film transistor is electrically connected with the corresponding scan line, the source electrode of the thin film transistor is electrically connected with the corresponding data line, and the drain electrode of the thin film transistor is electrically connected with the corresponding pixel electrode. Each row of the scan line input driving voltage, which can control each row of pixel electrode turn on successively, after turning on of the pixel electrode each row of the data line input driving voltage, so that the pixel electrode write voltage to realize the image display.

Optionally, the second area comprises a plurality of connecting line assemblies 20 and a driver 30, each of the connecting line assemblies 20 comprises a wiring group 22 and an acquisition module 21. The driver 30 is electrically connected with the input end of the wiring group 22, the driver 30 provides input voltage to the wiring group 22, and the output end of the wiring group 22 is electrically connected with the data line. The acquisition module 21 is electrically connected with the output end of the wiring group 22, and the output end of the acquisition module 21 is electrically connected with the driver 30. The acquisition module 21 is used to detect the electrical parameters of the wiring group 22 and feed it back to the driver 30. The driver 30 controls the input voltage according to the electrical parameters of different wiring group 22, so that the drive voltage input by each data line is equal.

Optionally, the second area comprises a plurality of connecting line assemblies 20 and a driver 30, each of the connecting line assemblies 20 comprises a wiring group 22 and an acquisition module 21. The driver 30 is electrically connected with the input end of wiring group 22 and provides input voltage to wiring group 22, and the output end of wiring group 22 is electrically connected with the scanning line. The wiring group 22 provides input driving voltage for the scanning line. The acquisition module 21 is electrically connected with the output end of the wiring group 22, and the output end of the acquisition module 21 is electrically connected with the driver 30. The acquisition module 21 is used to detect the electrical parameters of the wiring group 22 and feed it back to the driver 30. The driver 30 controls the input voltage according to the electrical parameters of different wiring group 22. Thus, the driving voltage of each scan line input is equal.

The first direction can be the direction from top to bottom, the array substrate 1 will be located above the second polarizer 5. The first direction can be the direction from bottom to top, the array substrate 1 will be located below the second polarizer 5. The first direction can be the direction from left to right, the array substrate 1 will be located on the left side of the second polarizer 5, etc., which are not exhaustive in this disclosure.

According to the liquid crystal display panel 100 of an embodiment of the present disclosure, the display uniformity can be improved, and the possibility of occurrence of a split screen afterimage and other phenomena can be reduced.

Third Embodiment

Figure 5:
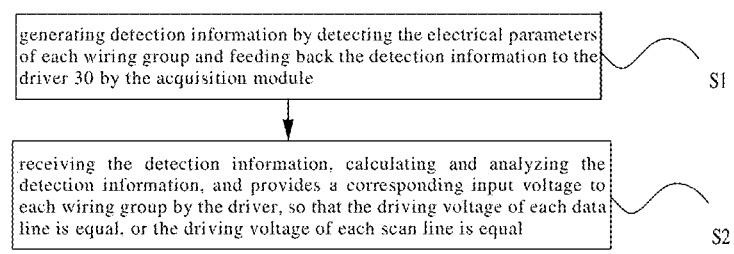
FIG. 5 is a schematic flowchart of a control method according to an embodiment of the present disclosure.

As shown in FIG. 5, a control method according to an embodiment of the present disclosure, used for the array substrate 1 in the first embodiment, comprises:

Step S1: generating detection information by detecting the electrical parameters of each wiring group 22 and feeding back the detection information to the driver 30 by the acquisition module 21;

Step S2: receiving the detection information, calculating and analyzing the detection information, and provides a corresponding input voltage to each wiring group 22 by the driver 30, so that the driving voltage of each data line is equal, or the driving voltage of each scan line is equal.

In step S1, in the case that the acquisition module 21 collects current parameters, the driver 30 provides the same detection voltage to the multiple wiring groups 22 and feeds back different current data to the driver 30 through the acquisition module 21, according to the feedback current data, after calculating and analyzing, the driver 30 input corresponding input voltages to different wiring groups 22, so that the currents in the wiring groups 22 are the same. In the case that each wiring group 22 is electrically connected with each data line, currents flowing through different data lines are the same, since the impedances of the data lines are the same, the driving voltages of the data lines are the same, thereby preventing uneven brightness in the horizontal direction of the liquid crystal display panel 100; in the case that each wiring group 22 is electrically connected with each scanning line, since the impedance of each scan line is the same, the driving voltage of each scan line is the same, thereby preventing uneven brightness in the vertical direction of the liquid crystal display panel 100.

The control method according to an embodiment of the present disclosure enables the driver 30 to provide different input voltages according to the impedance of each wiring group 22, so that the driving voltage of each data line is equal, or the driving voltage of each scan line is equal, thereby improving the display effect of the liquid crystal display panel 100.

In the description of the present disclosure, it should be understood that the terms "upper", "lower", "left", "right", "inner", "outer", "axial", "radial", "circumferential" etc., indicating the orientation or positional relationship are based on the orientation or positional relationship shown in the accompanying drawings, which is only for the convenience of describing the present disclosure and simplifying the description, rather than indicating or implying that the referred device or element must have a specific orientation, a specific orientation, or a specific orientation. The orientation configuration and operation of the device should not be construed as a limitation of the present disclosure. Furthermore, features delimited with "first", "second" may expressly or implicitly comprise one or more of that feature. In the description of the present disclosure, unless otherwise specified, "plurality" means two or more.

In the description of the present disclosure, it should be noted that the terms "installed", "connected" and "connected" should be understood in a broad sense, unless otherwise expressly specified and limited, for example, it may be a fixed connection or a detachable connection, or integral connection; can be mechanical connection, can also be electrical connection; can be directly connected, can also be indirectly connected through an intermediate medium, can be internal communication between two elements. For those of ordinary skilled in the art, the specific meanings of the above terms in the present disclosure can be understood in specific situations.

In the description of this specification, reference to the terms "one embodiment," "some embodiments," "exemplary embodiment," "example," "specific example," or "some examples", etc., is meant to incorporate the particular feature, structure, material, or characteristic described by the embodiment or example and comprised in at least one embodiment or example of the present disclosure. In this specification, schematic representations of the above terms do not necessarily refer to the same embodiment or example. Furthermore, the particular features, structures, materials or characteristics described may be combined in any suitable manner in any one or more embodiments or examples.

What is claimed is:

1. An array substrate for a liquid crystal display panel, wherein
the liquid crystal display panel comprises a display area and a non-display area, the array substrate comprises a first area and a second area, the first area corresponds to the display area, the second area corresponds to the non-display area;
the first area comprises a plurality of pixel parts, a plurality of first control lines and a plurality of second control lines, the first control lines comprise one of a scan line and a data line, the second control line comprises the other one of the scan line and the data line, wherein,
the second area comprises a plurality of connecting wire assemblies and a driver, each of the connecting wire assemblies comprises a wiring group and an acquisition module,
the driver is electrically connected with the input end of the wiring group, to provide input voltage to the wiring group, the output end of the wiring group is electrically connected with the first control line, the input end of the acquisition module is electrically connected with the output end of the wiring group, the output end of the acquisition module is electrically connected with the driver, and the acquisition module is used for detecting the electrical parameters of the wiring group and feeding the electrical parameters back to the driver;
wherein the acquisition module comprises a sampling circuit and an analog-to-digital converter, an input end of the sampling circuit is electrically connected with an output end of the wiring group, an output end of the sampling circuit is electrically connected with an input end of the analog-to-digital converter, and the output end of the analog-to-digital converter is electrically connected with the driver; and
the wiring group comprises a first wiring and a second wiring, the first wiring comprises a first end and a second end, the second wiring group comprises a third end and a fourth end, the first end and the third end are both electrically connected with the input end of a same first control wire, the second end is electrically connected with the driver, the fourth end is electrically connected with the output end of the sampling circuit.

2. The array substrate of claim 1, wherein the sampling circuit comprises an amplifier and a filter capacitor, the amplifier is configured to amplify the collected electrical parameter information, and the filter capacitor is configured to filter and absorb current fluctuations generated during the operation of the sampling circuit.

3. The array substrate of claim 1, wherein the electrical parameters of the wiring group measured by the acquisition module comprise one of current, voltage, or impedance.

4. The array substrate of claim 1, wherein the array substrate further comprises a substrate, a first metal layer, an insulating layer, a semiconductor layer and a second metal layer sequentially stacked along a first direction, the first control line, the first wiring and the second wiring are all disposed on the second metal layer, with projecting in a plane parallel to the substrate, the first wiring and the second wiring are spaced apart.

5. The array substrate of claim 1, wherein the array substrate further comprises a substrate, a first metal layer, an insulating layer, a semiconductor layer and a second metal layer sequentially stacked along the first direction, the first control line and the first wiring are both provided on one of the first metal layer and the second metal layer, the second wiring is provided on the other of the first metal layer and the second metal layer, with projecting in a plane parallel to the substrate, the first wiring and the second wiring are spaced apart or at least partially overlapped.

6. The array substrate of claim 4, wherein the first wiring and the second wiring have the same line width.

7. The array substrate of claim 1, wherein the spacing between the first wiring and the second wiring is greater than or equal to 6 μm.

8. The array substrate of claim 1, wherein a switching triode is provided between a connecting wire assembly and a corresponding first control line, a gate electrode of the switching triode is electrically connected with the first end, the drain electrode of the switching triode is electrically connected with the third end, the source electrode of the switching triode is electrically connected with the first control line, and the gate electrode of the switching triode is short-connected with the drain electrode of the switching triodes.

9. The array substrate of claim 1, wherein the acquisition module comprises a current sensor, the wiring group comprises a first wiring and a second wiring, the first wiring comprises a first end and a second end, the second wiring comprises a third end and a fourth end, the first end and the third end are both electrically connected with the input end of a same first control line, the second end and the fourth end are respectively electrically connected with two ends of the acquisition module, and the acquisition module is electrically connected with the driver.

10. The array substrate of claim 1, wherein a plurality of the connecting line assemblies correspond to a plurality of the data lines one by one, and the output end of each wiring group is electrically connected with the data line.

11. A liquid crystal display panel, with a display area and a non-display area, wherein
the liquid crystal display panel comprises a first polarizing plate, an array substrate, a liquid crystal layer, a color filter substrate and a second polarizing plate stacked in sequence along a first direction;
the array substrate comprises the first area and the second area, the first area corresponds to the display area, the second area corresponds to the display area, the first area comprises a plurality of pixel parts, a plurality of first control line and a plurality of second control line, the first control line comprises one of scanning line and data line, the second control line comprises the other one of scanning line and data line; and
the second area comprises a plurality of connecting line assemblies and a driver, each of the connecting line assemblies comprises a wiring group and an acquisition module, the driver is electrically connected with the input end of the wiring group to provide input voltage to the wiring group, the output end of the wiring group is electrically connected with the first control line, the input end of the acquisition module is electrically connected with the output end of the wiring group, the output end of the acquisition module is electrically connected with the driver, and the acquisition module is configured to detect the electrical parameters of the wiring group and feedback to the driver;
wherein the acquisition module comprises a sampling circuit and an analog-to-digital converter, an input end of the sampling circuit is electrically connected with an output end of the wiring group, an output end of the sampling circuit is electrically connected with an input end of the analog-to-digital converter, and the output end of the analog-to-digital converter is electrically connected with the driver; and
the wiring group comprises a first wiring and a second wiring, the first wiring comprises a first end and a second end, the second wiring group comprises a third end and a fourth end, the first end and the third end are both electrically connected with the input end of a same first control wire, the second end is electrically connected with the driver, the fourth end is electrically connected with the output end of the sampling circuit.

12. A control method, comprising:
generating detection information by detecting the electrical parameters of each wiring group, and feeding back the detection information to the driver by the acquisition module; and
receiving the detection information, calculating and analyzing the detection information and providing a corresponding input voltage to each of the wiring groups by the driver, so that the driving voltage of each data line is equal or the driving voltage of each scan line is equal;
wherein the acquisition module comprises a sampling circuit and an analog-to-digital converter, an input end of the sampling circuit is electrically connected with an output end of the wiring group, an output end of the sampling circuit is electrically connected with an input end of the analog-to-digital converter, and the output end of the analog-to-digital converter is electrically connected with the driver; and
the wiring group comprises a first wiring and a second wiring, the first wiring comprises a first end and a second end, the second wiring group comprises a third end and a fourth end, the first end and the third end are both electrically connected with the input end of a same first control wire, the second end is electrically connected with the driver, the fourth end is electrically connected with the output end of the sampling circuit.

13. The control method of claim 12, wherein by means of the acquisition module different current data will be feedback to the driver, the driver input corresponding input voltage to different wiring groups after calculation and analysis according to the feedback of the current data.

* * * * *